United States Patent [19]

Chino et al.

[11] Patent Number: 5,308,440
[45] Date of Patent: May 3, 1994

[54] METHOD OF MAKING SEMICONDUCTOR DEVICE WITH AIR-BRIDGE INTERCONNECTION

[75] Inventors: Toyoji Chino; Kenichi Matsuda; Jun Shibata, all of Osaka, Japan

[73] Assignee: Matsushita Electric Industrial Co., Ltd., Osaka, Japan

[21] Appl. No.: 939,230

[22] Filed: Sep. 2, 1992

[30] Foreign Application Priority Data

Sep. 5, 1991 [JP] Japan ................. 3-225707

[51] Int. Cl.⁵ ............................................. B44C 1/22
[52] U.S. Cl. .................................... 156/664; 437/184; 437/927; 148/DIG. 105
[58] Field of Search ............... 437/64, 133, 184, 927, 437/962, 228; 156/656, 657, 664; 148/DIG. 20, DIG. 105

[56] References Cited

U.S. PATENT DOCUMENTS

| 4,637,129 | 6/1987 | Derkits et al. ........... 148/DIG. 105 |
| 4,683,159 | 7/1987 | Bohrer et al. .................. 428/700 |
| 4,871,687 | 10/1989 | Donzelli ........................ 437/927 |
| 4,962,058 | 10/1990 | Cronin et al. .................. 437/228 |
| 4,987,101 | 1/1991 | Kaanta et al. .................. 437/927 |
| 5,162,258 | 11/1992 | Lemnios et al. ................ 437/184 |

FOREIGN PATENT DOCUMENTS 61-53733 3/1986 Japan .

OTHER PUBLICATIONS

"Air Bridges"; Howes, Gallium Arsenide; 1985, p. 485.

Primary Examiner—Brian E. Hearn
Assistant Examiner—C. Chaudhari
Attorney, Agent, or Firm—Lowe, Price, LeBlanc & Becker

[57] ABSTRACT

A semiconductor device with air-bridge interconnection comprises: a substrate; a plurality of mesas with distance therebetween smaller than a predetermined value; and a metal layer supported by the plurality of mesas, the metal layer having a narrow portion at the intermediate portion thereof and both ends having larger width than the narrow portion. The air-bridge interconnection is obtained by side-etching controlled during dry-etching using interconnection metal layer as an etching-mask to remove a mass of semiconductor material under the interconnection metal layer. A method of producing the semiconductor device comprises the steps of forming a semiconductor material; forming a metal layer on a portion of the semiconductor material having a narrow portion in the intermediate portion thereof; and forming the air-bridge interconnection by dry-etching with side-etching controlled to form a groove having a predetermined depth; then forming a resistive layer on the bottom of the layer; and then dry-etching the semiconductor material and the metal layers again to remove a mass of the semiconductor material under the metal layer.

12 Claims, 7 Drawing Sheets

METHOD OF MAKING SEMICONDUCTOR DEVICE WITH AIR-BRIDGE INTERCONNECTION

BACKGROUND OF THE INVENTION

1. Field of the Invention

This invention relates to a semiconductor device with air-bridge interconnection and a method of producing the same.

2. Description of the Prior Art

A semiconductor device with air-bridge interconnection is known. Such air-bridge interconnection interconnects electrodes formed on neighbouring mesas formed on a substrate, and particularly interconnects lines crossing each other. That is, the air-bridge interconnection isolates an interconnection line from elements, such as transistors by holes or grooves. After devices are formed on a semiconductor substrate using ion implantation, an air-bridge is built over the groove between mesas to form the interconnection line. In the normal atmosphere, the air isolates these interconnection lines or elements therebetween.

If isolation between an interconnection metal and other portion is made by a dielectric substance or insulator, line capacitance therebetween becomes larger. The air-bridge interconnection can reduce the line capacitance because the dielectric substance or the insulator is the air.

Figure 9A:
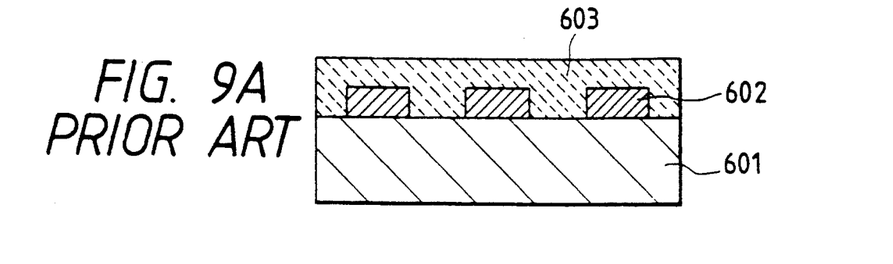
FIG. 9A to 9C are cross-sectional views of a prior art semiconductor device to explain the method of producing the air-bridge interconnection.
Figure 9B:
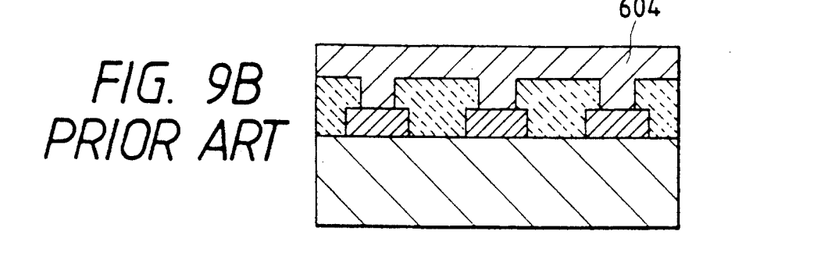
Figure 9C:
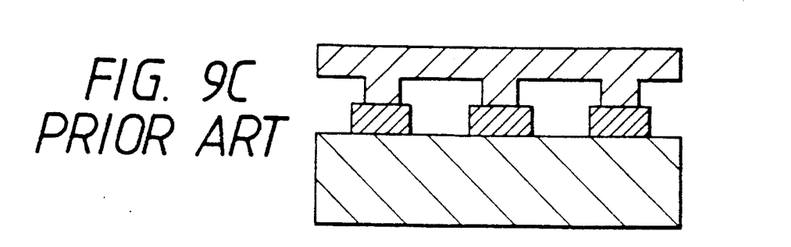

The method of producing the air-bridge interconnection is disclosed in Gallium Arsenide-Materials, Devices, and Circuits. John Wiley & Sons (1985), Chichecter, U.K., at page 485. This method will be described with reference to FIGS. 9A to 9C. FIGS. 9A to 9C are cross-sectional views of a prior art semiconductor device for explaining the method of producing the air-bridge interconnection in order of steps of processing. In FIG. 9A, a substrate 601 on which electrodes 602 are formed, is covered with a resist 603. Then the resist 603 is cured. Portions of the resist 603 on the electrodes 602 are removed. Then, on the electrodes 602 and the cured resist 603, an interconnection metal layer 604 are deposited as shown in FIG. 9B. The interconnection metal 604 is formed in a desired shape. Then, the resist 603 formed under the interconnection 604 is removed by an organic solvent. The interconnection forms a bridge over the groove between the electrodes 602, so that the line capacitance of the interconnection metal 604 is reduced.

However, there is a problem that in the semiconductor device having mesas formed by wet etching or dry etching up to the order of several micron meters, the air-bridge interconnection cannot be used.

Moreover, there is also problem that disconnection of the interconnection metal occurs because the resist 603 does not perfectly enter the isolation grove having several micron meters depth or the resist 603 formed under the interconnection metal 604 is not removed perfectly, so that the reliability of the semiconductor device decreases because the leavings of the resist 604 absorbs the humidity.

Further, the resist 603 must be removed by dry etching because if an organic solvent is used for removing the resist 603 formed on the electrodes 602 (wet etching), necessary portions of the resist 603 will be removed. The dry etching requires fine control of etching time to prevent the mesa, that is, the electrode 602, from damage, so that processing is complicated.

SUMMARY OF THE INVENTION

The present invention has been developed in order to remove the above-described drawbacks inherent to the conventional a semiconductor device with air-bridge interconnection and a method of producing the same.

The air-bridge interconnection is obtained by side-etching controlled during dry-etching using interconnection metal layer as an etching-mask to remove a mass of semiconductor material under the interconnection metal layer.

According to the present invention there is provided a semiconductor device having air-bridge interconnection, comprising: a substrate; a plurality of mesas with distance therebetween smaller than a predetermined value; and a metal layer supported by the plurality of mesas, the metal layer having a narrow portion at the intermediate portion thereof and both ends having larger width than the narrow portion. A level of a bottom of the metal layer from the substrate is determined by height of the mesas. The mesas are overhung with the both ends of the metal layer. The metal layer comprises Ti or a Ti layer and an Au layer covered with the Ti layer.

According to the present invention there is also provided a semiconductor device having air-bridge interconnection, comprising: a substrate; a plurality of mesas made of one or more semiconductor materials with distance therebetween smaller than a predetermined value; a lowland portion formed on the substrate around the plurality of mesas; a metal layer supported by the plurality of mesas, the metal layer having a narrow portion at the intermediate portion thereof and both ends having larger width than the narrow portion; a resistive layer covering the lowland portion other than areas under the metal layer, the resistive layer having a larger resistivity against a predetermined etching agent, i.e., a mixed gas including a reactive gas, than the semiconductor material.

According to the present invention there is also provided a method of producing a semiconductor device having an air-bridge interconnection comprising the steps of: forming a semiconductor material; forming a metal layer on a portion of the semiconductor material having a narrow portion in the intermediate portion thereof and both ends having larger width than the narrow portion; and forming the air-bridge interconnection by etching with side-etching controlled to remove a mass of the semiconductor material under the metal layer.

According to the present invention there is further provided method of producing a semiconductor device having an air-bridge interconnection comprising the steps of: forming a semiconductor material; forming a metal layer on a portion of the semiconductor material having a narrow portion in the intermediate portion thereof and both ends having larger width than the narrow portion; and forming the air-bridge interconnection by etching with side-etching controlled to form a groove having a predetermined depth with a mixed gas including a reactive gas; forming a resistive layer on the bottom of the layer; and etching the semiconductor material and the metal layers again to remove a mass of the semiconductor material under the metal layer, the resistive layer having a larger resistivity against the mixed gas than the semiconductor material.

BRIEF DESCRIPTION OF THE DRAWINGS

The object and features of the present invention will become more readily apparent from the following detailed description taken in conjunction with the accompanying drawings in which.

The same or corresponding elements or parts are designated as like references throughout the drawings.

DETAILED DESCRIPTION OF THE INVENTION

Hereinbelow will be described a first embodiment of this invention with reference to drawings.

Figure 1:
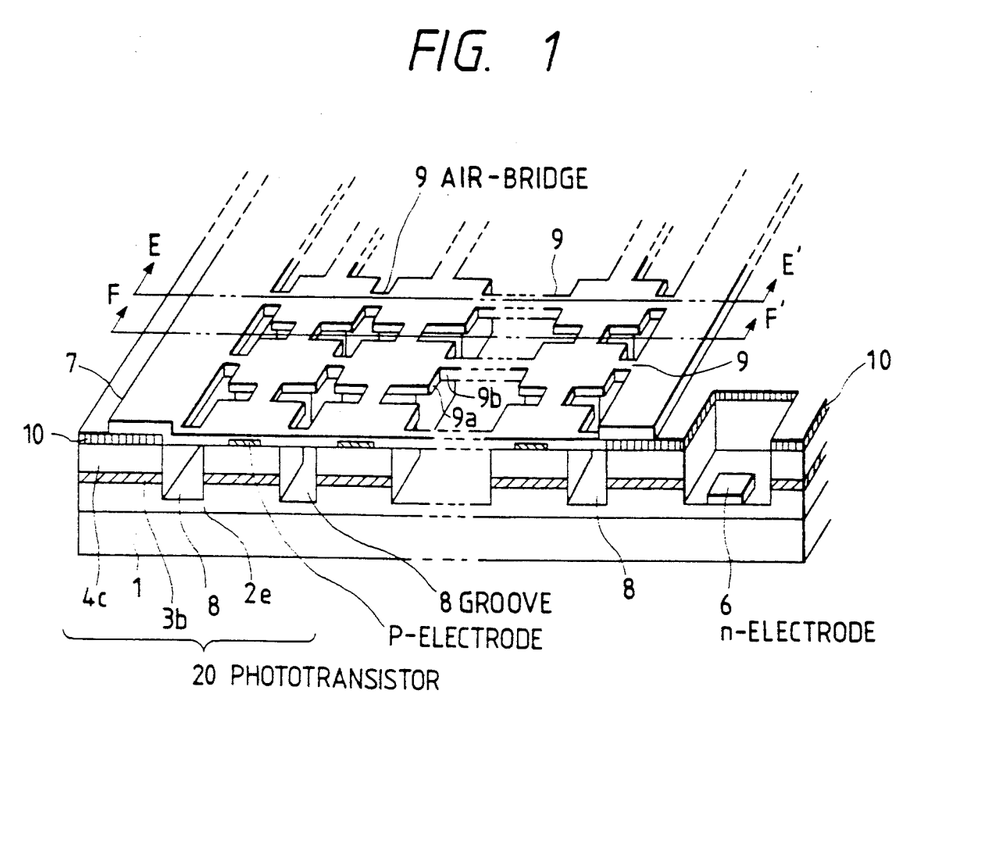
FIG. 1 is a perspective view of the first embodiment of a semiconductor device with air-bridge interconnection.
Figure 2:
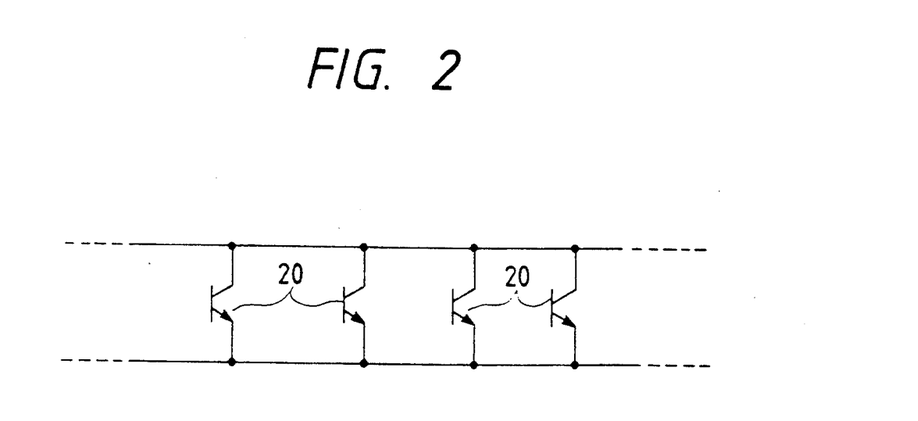
FIG. 2 is a schematic circuit diagram of first and second embodiments.

FIG. 1 is a perspective view of the first embodiment of a semiconductor device with air-bridge interconnection (air-bridge structure). The semiconductor device includes a plurality of heterojuction phototransistors connected electrically in parallel. FIG. 2 is a schematic circuit diagram of the first embodiment showing these heterojuction phototransistors connected electrically in parallel. In FIG. 1, numeral 1 is a substrate formed of n-InP (n-InP substrate), numeral 2e denotes an emitter formed of n-InP, numeral 3b is a base formed of p-InGaAsP, and numeral 4c denotes a collector. Numeral 5 is a p-electrode formed on a mesa including the collector 4c, base 3b, and emitter 2e. Numeral 6 is an n-electrode (cathode), numeral 7 is an interconnection metal for interconnecting collectors 4c in parallel and is used as a mask when air-bridges 9 are formed. Numeral 8 denotes an isolation groove for isolating each of phototransistors 20 from other phototransistors 20 and the interconnection metal 7. The air-bridge 9 is a portion of the interconnection metal 7 and spans the groove 8 to interconnect collectors 4c of two adjacent phototransistors 20. The emitter 2e, base 3b, and collector 4c form one of phototransistors 20. When light having a predetermined wavelength incidents to one of the phototransistors 20 from its bottom surface, the light is absorbed in the base 3, so that the phototransistor 20 turns on. The interconnection metal 7 connects collectors 4c of the phototransistors 20 in parallel. The air-bridge 9 has a broader portion 9a at its both ends and a narrow portion 9b at its intermediate portion. That is, the mesa, that is, each of phototransistors 20 is overhung with the broader portion 9a.

As mentioned above, the phototransistors 20 are isolated by the isolation grooves 8 and the interconnection metal 7 is used as a mask when the grooves 8 are formed and then it is used for interconnection between phototransistors 20 as it is.

Hereinbelow will be described a method of the first embodiment of producing the semiconductor device.

Figure 3:
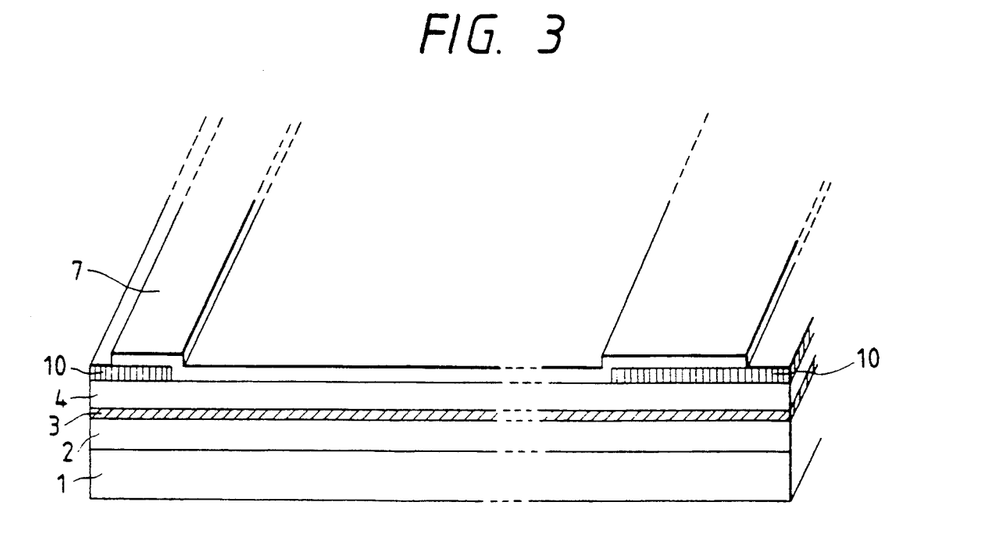
FIG. 3 is a partial perspective view for showing a step of producing the semiconductor device of the first and second embodiments.
Figure 4:
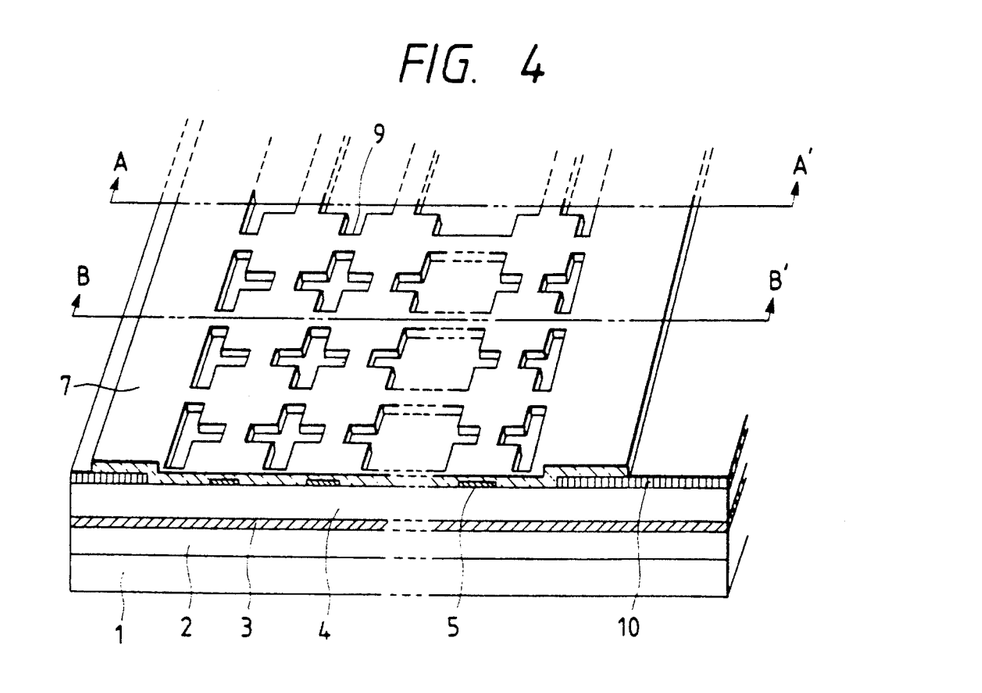
FIG. 4 is a partial perspective view for showing a step of producing the semiconductor device of the first and second embodiments.
Figure 5:
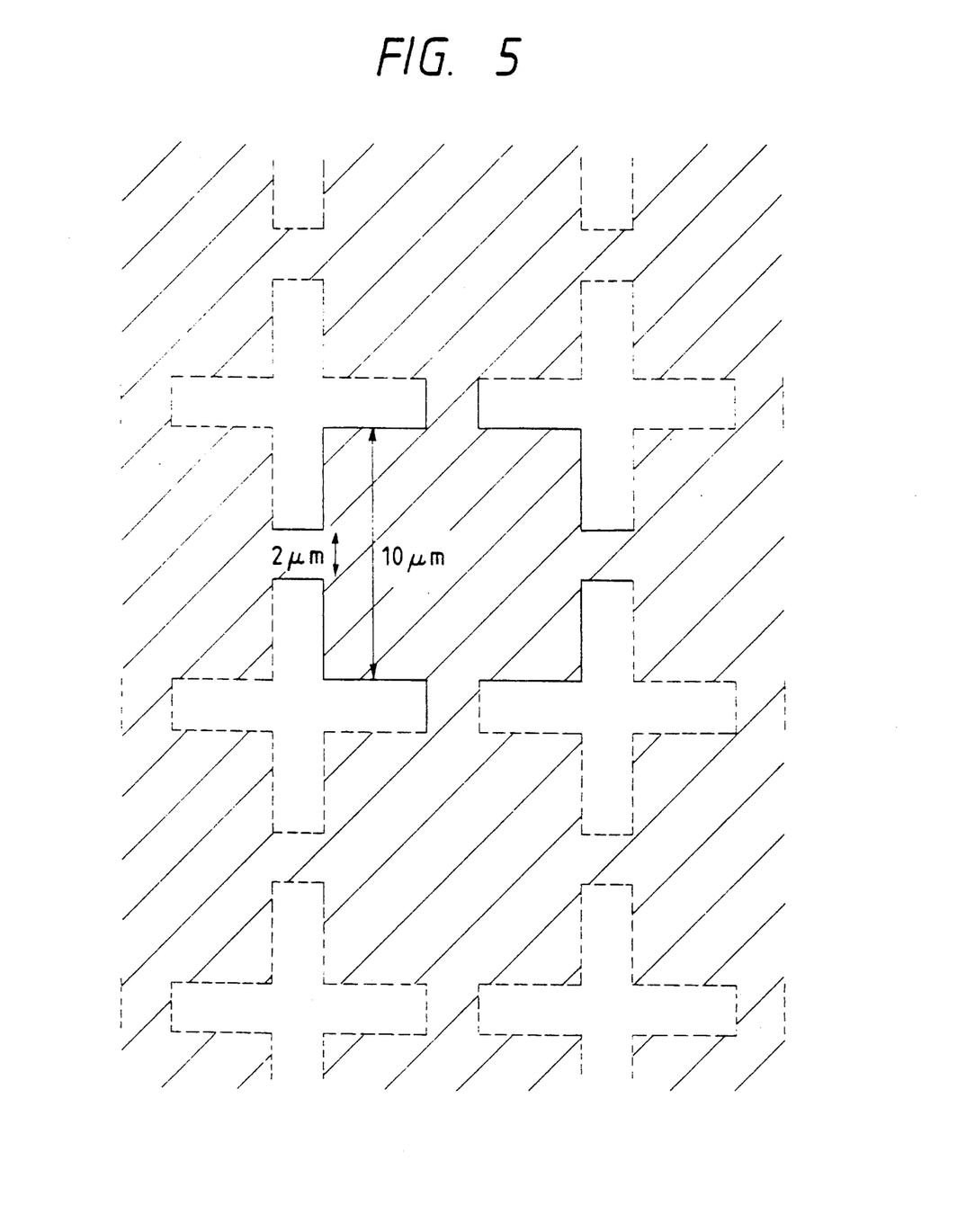
FIG. 5 is a partial plan view for showing a step of producing the semiconductor device of the first and second embodiments.
Figure 6A:
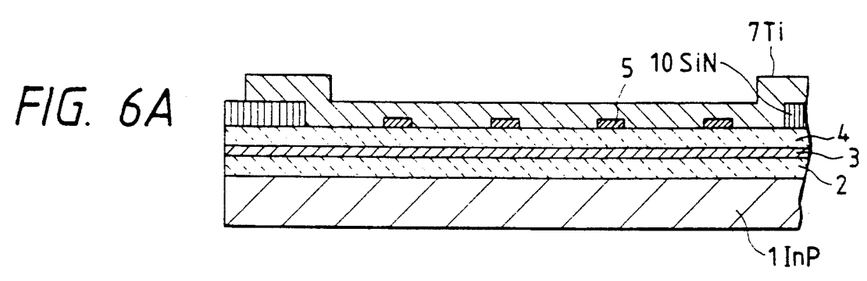
FIG. 6A is a cross-sectional view of FIG. 3 showing a step of the first and second embodiments.
Figure 6B:
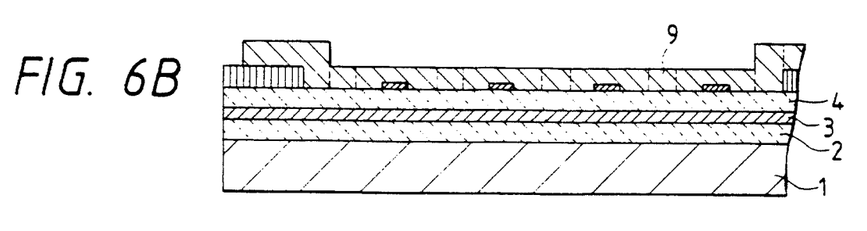
FIG. 6B is a cross-sectional view taken on line B—B' in FIG. 4.
Figure 6C:
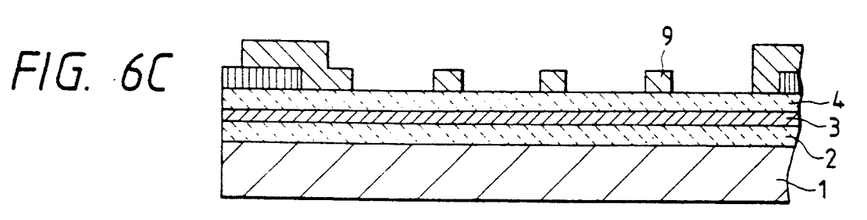
FIG. 6C is a cross-sectional view taken on line A—A' in FIG. 4, showing the second step.
Figure 6D:
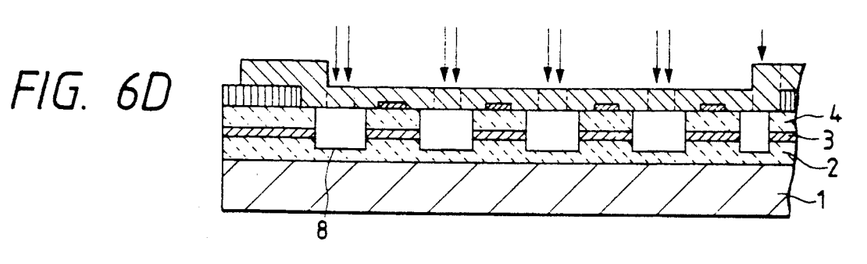
FIG. 6D is a cross-sectional view taken on line E—E' in FIG. 4.
Figure 6E:
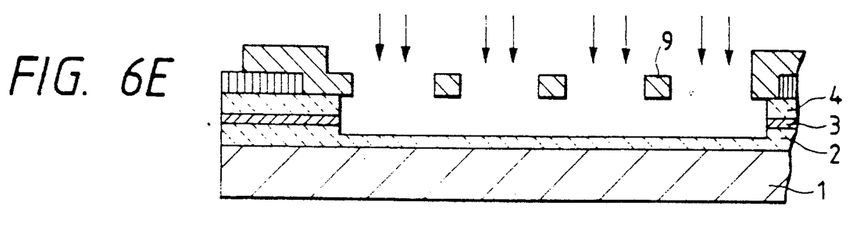
FIG. 6E is a cross-sectional view taken on line F—F' in FIG. 4.

FIG. 3 is a partial perspective view for showing a first step of producing the semiconductor device of the first embodiment. FIG. 4 is a partial perspective view for showing a second step of producing the semiconductor device of the first embodiment. FIG. 5 is a partial plan view for showing this second step of producing the semiconductor device of the first embodiment. FIG. 6A is a cross-sectional view of FIG. 3 showing the first step of the first embodiment. FIG. 6B is a cross-sectional view taken on line B—B' in FIG. 4, showing the second step. FIG. 6C is a cross-sectional view taken on line A—A' in FIG. 4, showing the second step. FIG. 6D is a cross-sectional view taken on line E—E' in FIG. 1, showing the third step. FIG. 6E is a cross-sectional view taken on line F—F' in FIG. 1, showing the third step. FIGS. 2, 3, 4, 5, 6A, 6B, 6C are also used to explain a second embodiment.

At the first step, on the n-InP substrate 1, an n-InP layer (emitter layer) 2, a p-InGaAsP layer (base layer) 3, and an n-InP layer (collector layer) 4 are formed with crystal growth in order of mention by the LPE method, the MOVPE method, or the MBE method as shown in FIG. 3. On the n-InP layer 4, an Sin film 10 as an insulator is deposited. Then, the deposited Sin film 10 is so formed to cover other portion of the n-InP layer 4 than the area where the phototransistors 20 are formed. Then, p-electrodes (anodes) 5 made of AuZn are formed. Ti is deposited thereon as the interconnection metal 7 by the electron beam deposition method. A thickness of the interconnection layer 7 is determined by a desired resistance of a line interconnecting two phototransistors 20.

At the second step, a resist layer (not shown) is formed on the interconnection metal 7 and the interconnection metal 7 is dry-etched with carbon tetrachloride gas ($CCl_4$ gas) using the resist layer to have the shape shown in FIG. 4. That is, as shown in FIG. 5, the Ti deposited is formed into the interconnection metal 7 such that squares are arranged at a regular interval, having 10 $\mu$m sides, each square having 2 $\mu$m squares at the center of respective 10 $\mu$m sides. Thus, the cross sections of the semiconductor device of this embodiment in this state are shown in FIGS. 6A and 6B.

At the third step, the semiconductor device of this embodiment in this state shown in FIGS. 6A and 6B are dry-etched with a mixed gas comprising argon gas Ar and bromine gas $Br_2$ as a reactive gas to form the isolating grooves 8, each groove having 2 $\mu$m to 10 $\mu$m depth. The mixed gas is denoted by arrows in FIGS. 6D and 6E. FIGS. 6D and 6E show cross sections taken on line E—E' and F—F' of FIG. 1 respectively at the end of the dry-etching process. That is, the n-InP layer 2, p-InGaAsP layer 3, and n-InP layer 4 under the interconnection metal 7 are removed by side-etching.

Bromine has a high reactivity, so that it etches the semiconductor material in not only the depth direction but in a direction perpendicular to the depth direction, that is, it etches side walls of a hole or groove etched (side-etching). Thus, the air-bridges 9 are left due to the side-etching by the mixed gas including the active gas as shown in FIG. 6E.

In this process, an amount of the side-etching is controlled by control of a partial pressure ratio of these gases, an rf power density, etching time, and a pressure in the reacting chamber where the etching is carried out.

After the etching, phototransistors 20 having mesa configurations are formed under the interconnection metal 7 used as a mask. That is, each of phototransistors 20 under the 10 μm square of interconnection metal 7 has a side of 6 to 8 μm because of the side-etching. That is, the mesa, i.e., each of phototransistors 20, is overhung with the broader portion 9a. The layers 4, 3, and 2 under the 2 μm square is removed because side-etching more than 1 μm occurs at both side thereof while 2 to 10 μm of isolation grooves 8 are formed by etching. Thus, the air-bridges 9 are left. They electrically connects the collectors 4c of the phototransistors 20 in parallel.

Possible conditions of dry-etching capable of side-etching of more than 1 μm thickness (depth) are as follows:

It is assumed that the partial pressure of the bromine gas is $P_{Br}$ and the partial pressure of the argon gas is $P_{Ar}$. The partial pressure ratio of these gases are given by $r = P_{Br}/(P_{Br}+P_{Ar})$. The dry-etching shows a considerable degree of anisotropic to the layers 2, 3, and 4 when $0.07 \leq r \leq 1.0$, so that side-etching is obtained. The side-etching of more than 1 μm is possible by setting the rf power density from 0.1 to 0.9 W/cm$^2$; etching time more than three minutes approximately; and the pressure in the reacting chamber 0.9 to 50 mTorr.

Hereinbelow will be described a second embodiment of this invention with reference to drawings.

Figure 7:
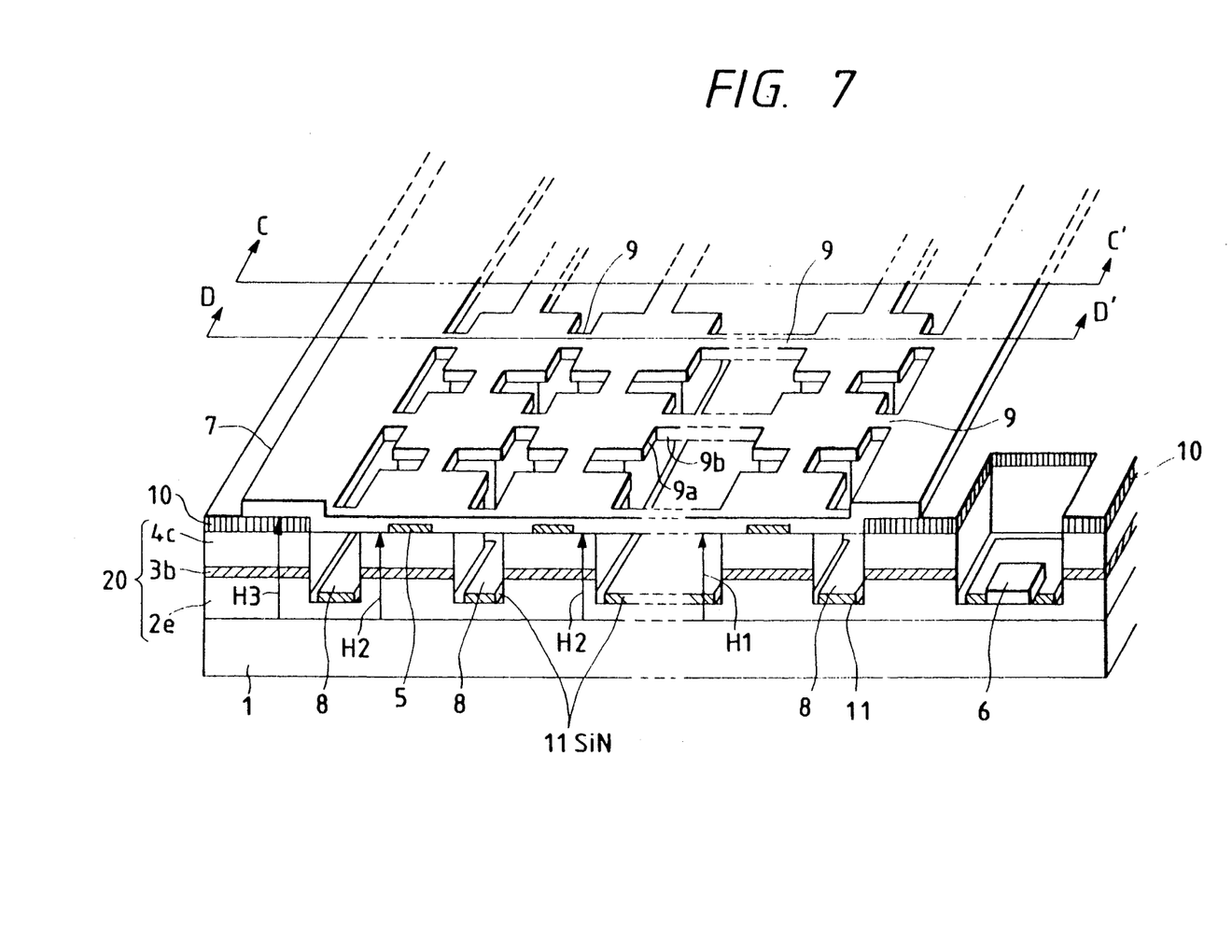
FIG. 7 is a perspective view of the second embodiment of a semiconductor device with air-bridge interconnection.

FIG. 7 is a perspective view of the second embodiment of a semiconductor device with air-bridge interconnection. The semiconductor device includes a plurality of heterojuction phototransistors connected electrically in parallel as similar to the first embodiment. That is, as shown in FIG. 2, heterojuction phototransistors 20 are connected electrically in parallel is shown in FIG. 7. In FIG. 7, basic structure is same as that of the first embodiment. A different point is that SiN films 11 are formed on the bottom of the isolation grooves 8. That is, the emitter 2 made of n-InP is formed on the substrate 1 made of n-InP (n-InP substrate). The base 3b is made of p-InGaAsP is formed thereon and the collector 4c is formed thereon. The p-electrode 5 is formed on a mesa including the collector 4c, base 3b, and emitter 2e, i.e., phototransistor 20. The n-electrode 6 (cathode) is formed on the emitter layer 2. The interconnection metal 7 interconnects collectors 4c in parallel and is used as a mask when air-bridges 9 are formed. The isolation groove 8 isolates each of phototransistors 20 from other phototransistors 20 and the interconnection metal 7. The air-bridge 9 is a portion of the interconnection metal 7 and spans the groove 8 to interconnect collectors 4c of two adjacent phototransistors 20. The emitter 2e, base 3b, and collector 4c form one of phototransistors 20. When light having a predetermined wavelength incidents to one of the phototransistors 20 from its bottom surface, the light is absorbed in the base 3, so that the phototransistor 20 turns on. The interconnection metal 7 connects collectors 4c of the phototransistors 20 in parallel.

As mentioned above, the phototransistors 20 are isolated by the isolation grooves 8 and the interconnection metal 7 is used as a mask when the grooves 8 are formed and then it is used for interconnection between phototransistors 20 as it is.

Hereinbelow will be described a method of the second embodiment of producing the semiconductor device.

FIGS. 2, 3, 4, 5, 6A, 6B, 6C used to explain the first embodiment are also used to explain a second embodiment.

Figure 8A:
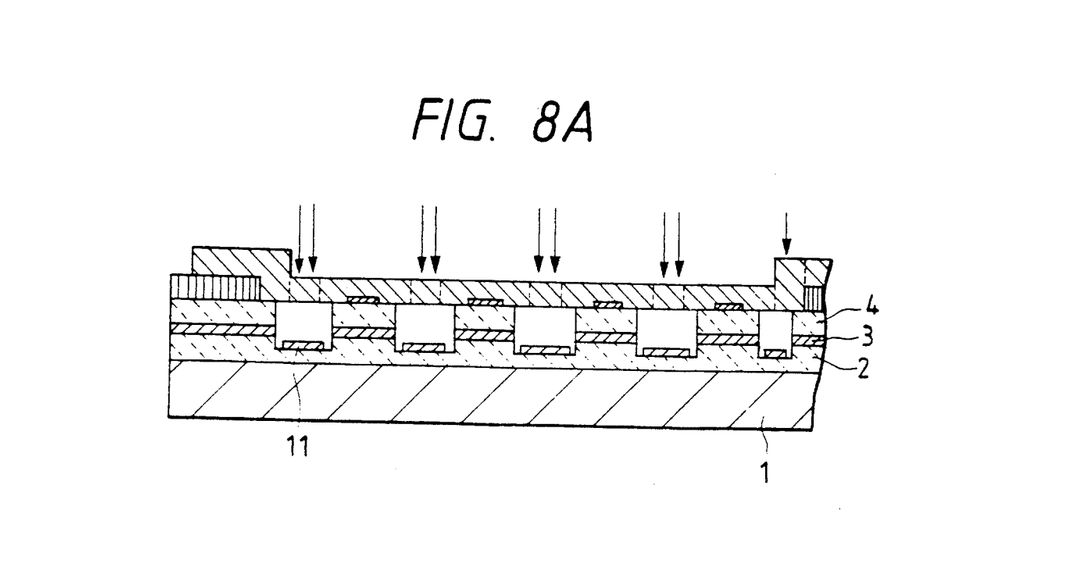
FIG. 8A is a cross-sectional view taken on line D—D' in FIG. 7.
Figure 8B:
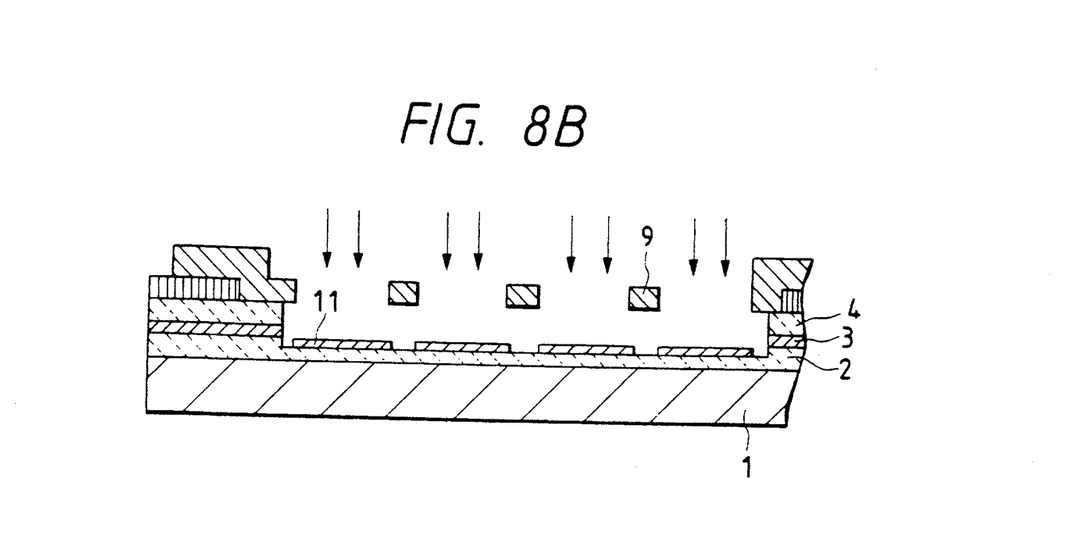
FIG. 8B is a cross-sectional view taken on line C—C' in FIG. 7.

FIG. 3 shows a first step of producing the semiconductor device of the second embodiment. FIG. 4 shows a second step of producing the semiconductor device of the second embodiment. FIG. 5 shows this second step of producing the semiconductor device of the second embodiment. FIG. 6A is a cross-sectional view of FIG. 3 showing the first step of the second embodiment. FIG. 6B is a cross-sectional view taken on line B—B' in FIG. 4, showing the second step. FIG. 6C is a cross-sectional view taken line A—A' in FIG. 4, showing the second step. FIG. 8A is a cross-sectional view taken on line D—D' in FIG. 7, showing the third step. FIG. 8B is a cross-sectional view taken on line C—C' in FIG. 7, showing the third step also.

At the first step, on the n-InP substrate 1, the n-InP layer (emitter layer) 2, the p-InGaAsP layer (base layer) 3, and the n-InP layer (collector layer) 4 are formed with crystal growth in order of mention by the LPE method, the MOVPE method, or the MBE method. On the n-InP layer 4, the Sin film 10 as an insulator is deposited. Then, the deposited Sin film 10 is so formed to cover other portion of the n-InP layer 4 than the area where the phototransistors 20 are formed. Then, p-electrodes (anodes) 5 made of AuZn are formed. Ti is deposited thereon as the interconnection metal 7 by the electron beam deposition method. A thickness of the interconnection layer 7 is determined by a desired resistance of a line interconnecting two phototransistors 20. The cross section of the semiconductor device of this embodiment in this state is shown in FIG. 6A.

At the second step, a resist layer (not shown) is formed on the interconnection metal 7 and the interconnection metal 7 is dry-etched with carbon tetrachloride gas (CCl$_4$ gas) using the resist layer to have the shape shown in FIG. 4. That is, as shown in FIG. 5, squares are arranged at a regular interval, having 10 μm sides, each square having 2 μm squares at the center of respective 10 μm sides. Thus, the cross sections of the semiconductor device of this embodiment in this state are shown in FIGS. 6B and 6C.

At the third step, the semiconductor device of this embodiment in this state shown in FIGS. 6B and 6C are dry-etched with a mixed gas, as an etching agent, comprising argon gas Ar and bromine gas Br2 as a reactive gas to form the isolating grooves 8, each groove 8 having about 5 μm depth.

At the fourth step, SiN is deposited on the semiconductor device processed after the third step by plasma CVD method. That is, SiN films 11 are formed on the bottom of the isolation grooves 8 to have a thickness of 1000 angstroms. SiN does not deposit on the side walls of the isolation grooves 8 because at the third step, the dry-etching by the reactive gas causes side-etching to some extent, so that the side walls of the isolation grooves 8 are shaded from SiN with edge portions, i.e., broader portions 9a of the interconnection metal 7.

At the fifth step, the second dry-etching with the mixture gas is executed as shown in FIGS. 8A and 8B. This provides side-etching to the side walls of the isolation grooves 8 more than 1 μm easily with etching speed in the depth direction reduced by the SiN films 11 because an etching speed of the mixed gas to the SiN films 11 one twelfth to three eighths of that to the InP substrate 1, the emitter layer 2, the base layer 3, and the collector layer 4.

After the etching, phototransistors 20 having mesa configurations are formed under the interconnection metal 7 used as a mask. That is, each of phototransistors 20 under the 10 μm square has a side of 6 to 8 μm because of the side-etching. The collector layer, base layer, and emitter layer 4, 3, and 2 under the 2 μm square is totally removed with a given depth because side-etching more than 1 μm occurs at both side thereof while 2 to 10 μm of isolation grooves 8 are formed by etching. That is, the mesa, i.e., each of phototransistors 20 is overhung with the broader portion 9a. Thus, the air-bridges 9 are left. They electrically connects the collectors 4c of the phototransistors 20 in parallel. On the interconnection metal 7, the SiN film 11 are also deposited. However, the deposited SiN film 11 is removed by the etching by the mixed gas because the SiN film 11 deposited on the interconnection metal 7 is exposed to the mixed gas in all directions except the interconnection metal 7. On the other hand, the SiN films 11 deposited on the bottoms of the grooves 8 are exposed to the mixed gas in only one direction. They are left finally but their thickness decrease. Therefore, FIG. 7 shows only the SiN films 11 formed on the bottom of the grooves 8.

Conditions of dry-etching are the same as those of the first embodiment. Difference of the embodiment from the first embodiment is as follows:

After first dry-etching providing 5 μm depth grooves, the Sin films 11 are deposited on the bottom surface of the isolation grooves 8. Then, side-etching is carried out with the speed of etching in the depth direction reduced, so that the air bridges 9 are formed. Thus, the second embodiment provides air-bridge interconnection more stable than the first embodiment.

In the first and second embodiments, Ti is used for the interconnection metal 7. However, if a surface of the interconnection metal 7 exposed to the mixed gas for etching is Ti, any metal can be used as a base covered with Ti. For example, combination Au and Ti can be used, Au and Ti being deposited in order of mention. Combinations Ti, Au, and Ti and Cr, Pt, Au, and Ti can used, these elements being deposited in order of mention. These combinations are selected in accordance with the resistance of interconnection metal 7. Moreover, bromine gas (Br$_2$) and argon (Ar) are used for dry-etching. However, chlorine gas (Cl$_2$ gas) or a mixed gas of chlorine (Cl$_2$ gas) and argon gas can be used also.

In the second embodiment, the SiN films 11 are formed after first dry-etching. However, SiO$_2$ or TiO$_2$ can be used in place with SiN films 11. Moreover, the SiN films 11 can be removed after the second dry-etching by cleaning with water or the like by dissolved with a solvent for the SiN films 11.

As mentioned above, this invention provides the air-bridge interconnection by etching with the side etching amount controlled using the interconnection metal 7 as a mask. Therefore, materials under the interconnection metal 7 are removed by side-etching. Portion of interconnection metal 7 forms the air-bridge 9 which interconnect the collectors of the elements of the semiconductor device, that is, phototransistors 20.

Moreover, once the dry-etching is executed to form isolation grooves 8 and then, SiN is deposited on the bottom surfaces of the isolation grooves 8. In the second dry-etching, the etching speed in the depth direction is reduced considerable by the SiN films 11. This provides the air-bridge interconnection by side-etching of crystals under the interconnection metal 7. Portion of interconnection metal 7 forms the air-bridges 9 which interconnect the collectors of the elements of the semiconductor device, that is, phototransistors 20.

As mentioned, the semiconductor device having air-bridge interconnection, comprises: a substrate 1; a plurality of mesas, that is, phototransistors 20 with distance therebetween smaller than a predetermined value; and a metal layer, i.e., interconnection metal 7, having a narrow portion in the intermediate portion thereof supported by the plurality of mesas, a level of a bottom of the metal layer from the substrate 1 agreeing with height of the mesas. The distance between the mesas is, for example, 2 μm in the first and second embodiment. However, the distance can be changed in accordance with thickness of the interconnection metal 7 or the like. As shown in FIG. 7, the level of the bottom of the interconnection metal 7 H1 agrees with the height of the mesa H2. The interconnection metal 7 has a narrow portion to be formed as the air-bridge. Both side of the air-bridge have a broader portion than the intermediate portion thereof.

As mentioned above, the semiconductor device of this invention, comprises: a semiconductor layer, that is the emitter, base, or collector layers 2, 3, or 4, and the interconnection metal 7 formed on a portion of the semiconductor layer having a narrow portion in the intermediate portion thereof; and an air-bridge interconnection formed such that: the semiconductor material and the interconnection metal 7 are dry-etched with side-etching controlled to remove a portion of the semiconductor layer under the interconnection metal 7. The air-bridge may span the isolation groove 8 between two different material and over two mesas having different heights. This is shown in FIG. 7, the air bridge 9 spans the isolation groove 8 between the insulation layer 10 having a height H3 and the collector 4c having the height H2.

As mentioned above, the method of producing a semiconductor device having an air-bridge interconnection, comprises the steps of: forming a semiconductor material, that is, emitter, base, or collector layer 2, 3, or 4; then, forming the interconnection metal 7 on a portion of the semiconductor material having a narrow portion in the intermediate portion thereof; and then forming the air-bridge interconnection by dry-etching with side-etching controlled to remove a portion of the semiconductor material under the interconnection metal 7.

What is claimed is:

1. A method of producing a semiconductor device having an air-bridge interconnection comprising the steps of:

(a) forming a semiconductor material;

(b) forming a metal layer on a portion of said semiconductor material having a narrow portion in an intermediate portion thereof and end portions of larger width than said narrow portion and adjacent said narrow portion; and (c) forming said air-bridge interconnection by etching said semiconductor material using said metal layer as a mask to cut said semiconductor material around said metal layer with side-etching controlled, a width of said narrow portion and widths of said end portions being determined such that cuts under said narrow portion on both sides of said narrow portion developed by said etching join together by said side-etching to remove a mass of said semiconductor material under said metal layer while leaving masses of said semiconductor material under said end portions.

2. A method of producing a semiconductor device having an air-bridge interconnection as claimed in claim 1, wherein said etching is performed with a mixed gas including a reactive gas.

3. A method of producing a semiconductor device having an air-bridge interconnection as claimed in claim 2, wherein said a reactive gas comprises bromine gas.

4. A method of producing a semiconductor device having an air-bridge interconnection as claimed in claim 1, wherein said etching is formed by a reactive gas.

5. The method of claim 4 wherein said reactive gas is selected from the group connecting of bromine and chlorine gas.

6. A method of producing a semiconductor device having an air-bridge interconnection as claimed in claim 1, wherein said first and second etchings are performed with a mixed gas including a reactive gas.

7. A method of producing a semiconductor device having an air-bridge interconnection comprising the steps of:

(a) forming a semiconductor material;

(b) forming a metal layer on a portion of said semiconductor material having a narrow portion in the intermediate portion thereof and end portions of larger width than said narrow portion adjacent said narrow portion; and (c) forming said air-bridge interconnection by first etching said semiconductor material using said metal layer as a mask to cut said semiconductor material around said metal layer with side-etching controlled to form a bottom having a predetermined depth from said metal layer; forming a resistive layer on said bottom; and etching said semiconductor material for a second time, a width of said narrow portion and widths of said end portions being determined such that cuts under said narrow portion on both sides of said narrow portion developed by said etching join together by said side-etching to remove a mass of said semiconductor material under said metal layer while leaving masses of said semiconductor material under said end portions, said resistive layer reducing an etching speed in the depth direction in said second etching.

8. A method of producing a semiconductor device having an air-bridge interconnection as claimed in claim 6, wherein said reactive gases comprises bromine gas.

9. A method of producing a semiconductor device having an air-bridge interconnection as claimed in claim 6, wherein said reactive gas comprises chlorine gas.

10. A method of producing a semiconductor device having an air-bridge interconnection as claimed in claim 6, wherein said resistive layer comprises an SiN film.

11. A method of producing a semiconductor device having an air-bridge interconnection as claimed in claim 6, wherein said resistive layer comprises an $SiO_2$ film.

12. A method of producing a semiconductor device having an air-bridge interconnection as claimed in claim 6, wherein said resistive layer comprises a resist layer.

* * * * *